United States Patent
Otsuka

[19]
[11] Patent Number: 6,040,591
[45] Date of Patent: Mar. 21, 2000

[54] SOLID STATE IMAGING DEVICE HAVING REFRACTIVE INDEX ADJUSTING LAYER AND METHOD FOR MAKING SAME

[75] Inventor: Youichi Otsuka, Kanagawa, Japan

[73] Assignee: Sony Corporation, Tokyo, Japan

[21] Appl. No.: 09/046,766

[22] Filed: Mar. 24, 1998

[30] Foreign Application Priority Data

Mar. 25, 1997 [JP] Japan ..................................... 9-071886

[51] Int. Cl.[7] ........................ H01L 27/148; H01L 29/768
[52] U.S. Cl. .......................... 257/232; 257/233; 257/432; 257/435; 257/437
[58] Field of Search .................................. 257/232, 233, 257/432, 435, 437

[56] References Cited

U.S. PATENT DOCUMENTS 5,479,049 12/1995 Aoki et al. ............................... 257/642
5,583,354 12/1996 Ishibe ...................................... 257/232
5,691,548 11/1997 Akio ....................................... 257/232
5,844,290 12/1998 Furumiya ................................ 257/432

*Primary Examiner*—Ngân V. Ngô
*Attorney, Agent, or Firm*—Hill & Simpson

[57] ABSTRACT

It is possible to provide a smaller-sized and higher resolution solid-state imaging device by making it possible to adjust a focal position without considerably changing a radius of curvature of a microlens formed on a photosensor portion and without increasing a thickness of a layer on the photosensor portion. A microlens (17) is formed at a corresponding position on a sensor portion (2). A layer (18) having low refractive index as compared with refractive index of the microlens (17). A solid-state imaging device (10) having an uppermost surface thereof formed as a substantially flat surface is arranged.

10 Claims, 6 Drawing Sheets

SOLID STATE IMAGING DEVICE HAVING REFRACTIVE INDEX ADJUSTING LAYER AND METHOD FOR MAKING SAME

BACKGROUND

1. Field of the Invention

The present invention relates to a solid-state imaging device having a microlens formed on a sensor portion.

2. Background of the Invention

In order to obtain a CCD solid-state imaging device having a smaller size and a higher resolution, a unit cell formed of a light sensor portion formed of a photodiode and a CCD register tends to be reduced in size.

For this end, an area of the photodiode serving as a photosensor portion is reduced, which lowers a photoelectric conversion characteristic which is one of the main characteristics of a CCD solid-state imaging device, i.e., light sensitivity.

A size of an optical system mainly employed for a commercial-purpose small-sized single-unit video camera-recorder has been practically shifted from ⅓ inch to ¼ and may further be shifted to ⅙ inch or smaller size.

The number of pixels widely ranges from 250,000 pixels, 360000 pixels, and 380,000 pixels to 560,000 pixels.

In order to improve the light sensitivity of such CCD solid-state imaging device, a so-called on-chip microlens technique of providing a microlens at a position corresponding to each of photodiodes to efficiently converge incident light to a photosensor portion has been established and introduced.

FIG. 1 is a cross-sectional view of a general CCD solid-state imaging device having an on-chip microlens formed therein, cut along the horizontal direction, i.e., a direction perpendicular to a transfer direction of a vertical CCD register.

As shown in FIG. 1, a charge transfer portion 32 forming a vertical CCD register 40 and a photodiode forming a light sensor portion 33 are formed of a diffusion layer or the like in a semiconductor substrate 31 made of silicon. A vertical transfer electrode 34 is formed on the charge transfer portion 32 through an insulating film. A light shielding film 35 is formed so as to cover the vertical transfer electrode 34. The photosensor portion 33 is formed so as to correspond to an opening of the light shielding film 35.

Moreover, a transparent flattening film 38 is formed so as to cover the light sensor portions 33 and the light shielding film 35. A color filter 37 is formed on a surface flattened by deposition of the transparent flattening film 36.

A transparent flattening film 38 is formed on the color filter 37. Further, micro lenses 39 whose surfaces have a certain curvature are formed on the transparent flattening film 38. Thus, the CCD solid-state imaging device 30 is formed.

In FIG. 1, it is assumed that optical paths of incident light L are those which are in parallel to one another and perpendicular to the CCD solid-state imaging device 30.

In FIG. 1, reference symbols f and r respectively represent a focal distance of the micro lens 39 and a radius of curvature of thereof.

While it is surely desired to further downsize a unit cell of the CCD solid-state imaging device 30, it is difficult for a single-layer micro lens shown in FIG. 1 to efficiently converge incident light L on the photosensor portion 33.

Specifically, as shown in FIG. 1, the light L made incident on the micro lens 39 is converged on a position f0 considerably higher as compared with the light sensor portion 33. This reduces an amount of light made incident on the light sensor portion 33 and consequently lowers light sensitivity.

As the focal position is located at an upper position above the photosensor portion 33, a so-called smear is easily produced because rays of light L once converged are made incident on the vertical CCD register 32. This phenomenon is more remarkably produced as the unit cell is more downsized.

In order to improve the problem of the convergence of light, it is necessary to mainly reduce a distance (hereinafter referred to as a layer thickness) h from a surface of the photosensor portion 33 to the microlens 39 and to increase a radius r of curvature of the microlens 39.

However, certain thicknesses of the flattening transparent films 36, 38, the color filter 37 for matching divided lights for respective colors of the CCD solid-state imaging device with one another, and so on are necessary in order to form the uniform color filter 37 and the uniform microlens 39, which limits an attempt to further reduce this layer thickness h.

In order to increase the radius r of the curvature of the microlens 39, it is necessary to set a thickness of a transparent film before reflowing thinner when the microlens 39 is formed by thermal reflow of transparent resin.

However, if the film thickness of the transparent resin forming the microlens 39 is set thinner, then, as shown in FIG. 3, a lens obtained after reflowing is shaped so as to be flat at a lens upper portion, which prevents the lens having a satisfactorily reflowed shape having a certain curvature and may prevent satisfactory convergence of light.

If the film thickness of the transparent resin is set thinner, influence of steps of a ground makes it difficult to coat transparent resin uniformly.

Therefore, there is a limit to increase the radius r of the curvature to form the uniform microlens.

SUMMARY OF THE INVENTION

In view of such aspects, it is an object of the present invention to provide a smaller-sized and higher resolution solid-state imaging device by making it possible to adjust a focal position without considerably changing a radius of curvature of a microlens formed on a photosensor portion and without increasing a thickness of a layer on the photosensor portion.

According to an aspect of the present invention, a solid-state imaging device includes a microlens formed at a corresponding position on a sensor portion, a layer having a low refractive index as compared with refractive index of the microlens, and an uppermost surface formed as a substantial flat surface.

According to the present invention, a layer formed on the microlens and having the low refractive index as compared with the refractive index of the microlens. Therefore, it is possible to set a convergence position of light made incident on the microlens to a deeper position as compared with that presented when there is air above the microlens.

Since the uppermost surface is made as a substantial flat surface, the light made incident on the uppermost surface perpendicularly thereto is prevented from being refracted.

DESCRIPTION OF THE PREFERRED EMBODIMENT

A solid-state imaging device according to the present invention includes a microlens formed at a corresponding position on a sensor portion, a layer having a low refractive index as compared with refractive index of the microlens, and an uppermost surface formed as a substantial flat surface.

The solid-state imaging device according to the present invention has an anti-reflection film formed on the layer having the low refractive index as compared with the refractive index of the microlens.

In the solid-state imaging device according to the present invention, a ratio of a length a of a short side of an opening of a sensor portion to a length b from a semiconductor surface to a lens bottom surface of the microlens is set to ⅓ or smaller.

A solid-state imaging device according to an embodiment of the present invention will hereinafter be described with reference to the accompanying drawings.

Figure 4:
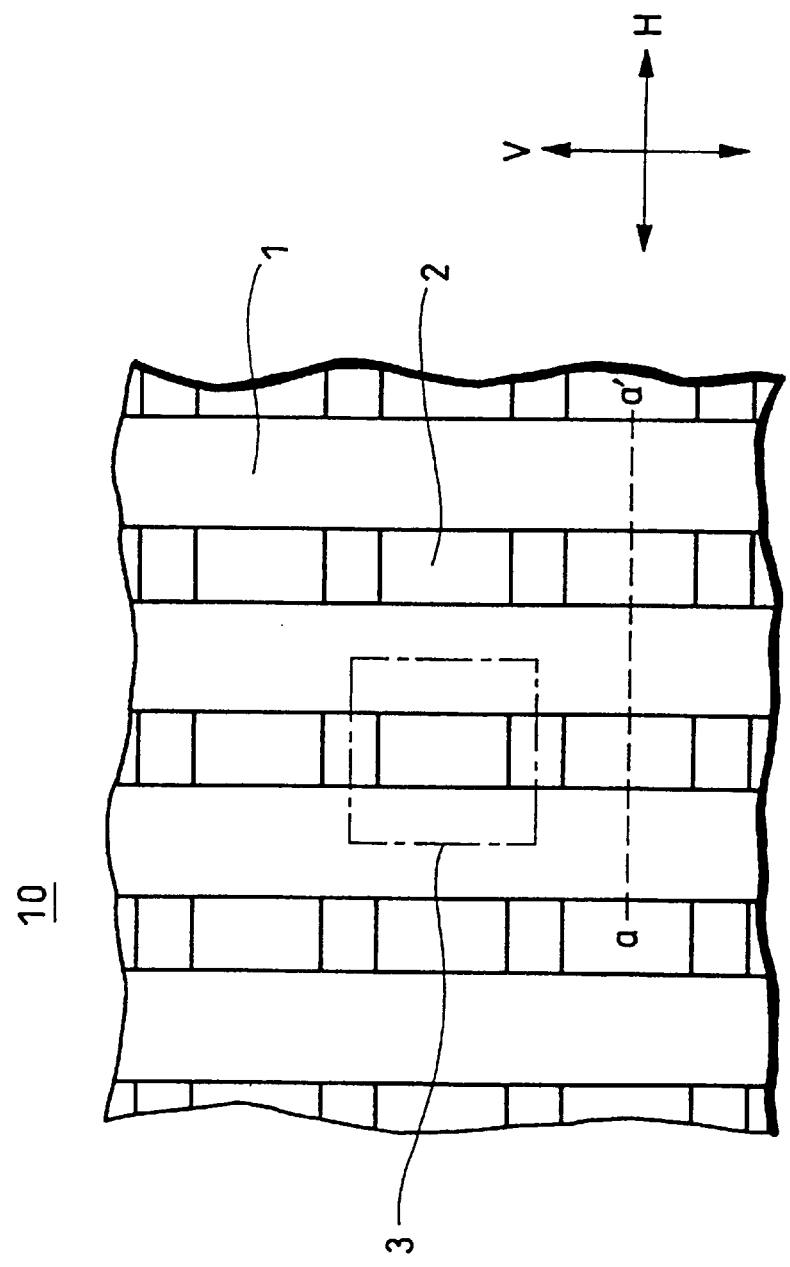
FIG. 4 is a plan view of a solid-state imaging device according to an embodiment of the present invention.
Figure 5:
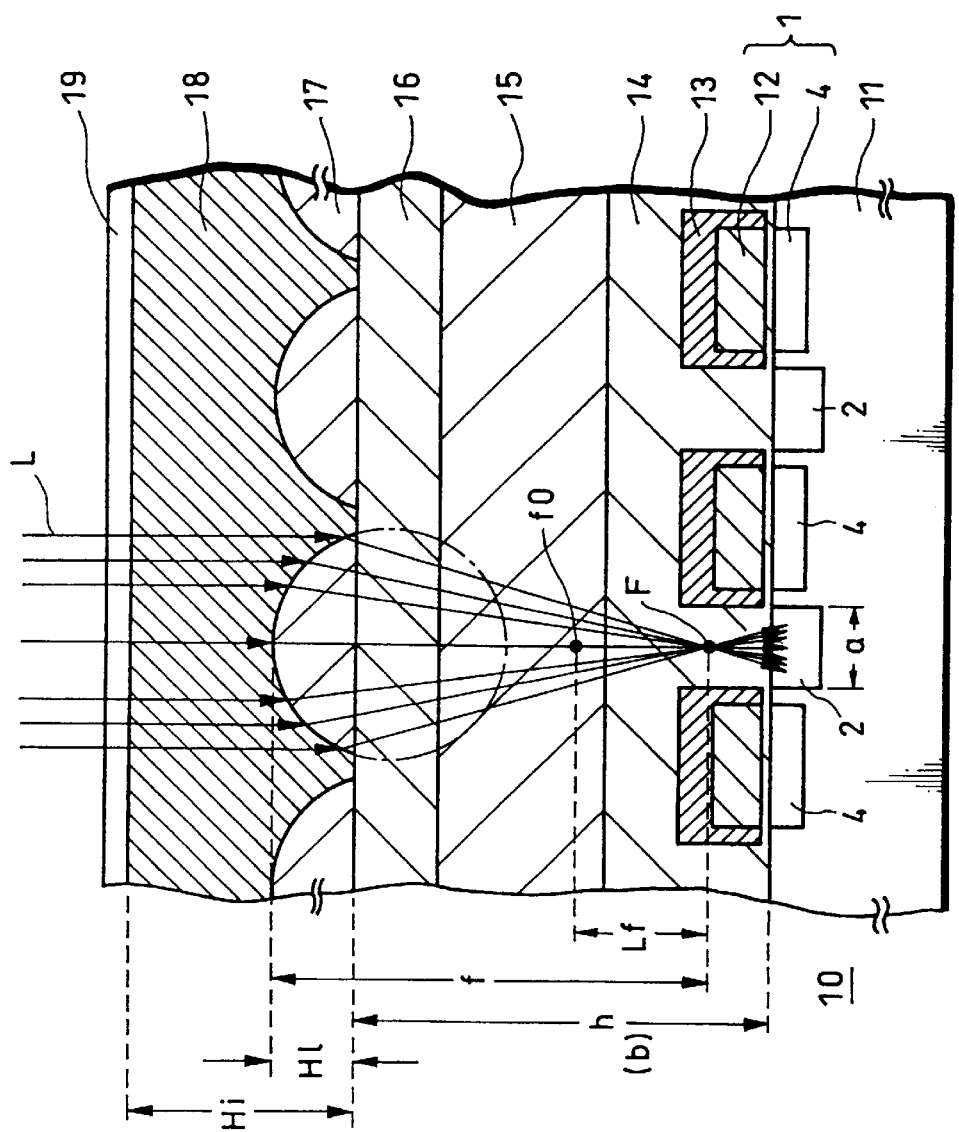
FIG. 5 is a cross-sectional view of the solid-state imaging device according to the embodiment of the present invention, cut along the horizontal transfer direction.

FIGS. 4 and 5 are diagrams showing a schematic arrangement of the solid-state imaging device according to the embodiment of the present invention, i.e., an interline transfer system CCD solid-state imaging device in this embodiment. FIG. 4 is a plan view of the solid-state imaging device according to the embodiment, and FIG. 5 is a cross-sectional view thereof in the horizontal transfer direction, i.e., in a so-called H direction (or curt along a line a—a' in FIG. 4).

As shown in FIG. 4, a CCD solid-state imaging device 110 has a photosensor portion (sensor portion) 2 formed of photodiodes disposed in a matrix fashion in its imaging region, and a vertical CCD register 1 provided so as to correspond to each of columns of the light sensor portions 2. A unit cell 3 is formed of one light sensor portion 2 and one vertical CCD register 1.

As shown in FIG. 5 which shows a cross-sectional structure thereof, a photodiode forming the photosensor portion 2 and a charge transfer portion 4 forming the vertical CCD register 1 are formed of diffusion layers and so on in a semiconductor substrate 1 made of silicon, for example. A vertical transfer electrode 12 is formed on the charge transfer portion 4 through an insulating film. A light shielding film 13 is formed so as to cover the vertical transfer electrode 12. As shown in FIG. 5, the photosensor portion 2 is formed so as to correspond to an opening of the light shielding film 13.

A transparent flattening film 14 is formed so as to cover the photosensor portion 2 and the light shielding film 13, and a color filter 15 is formed on a surface flattened by the transparent flattening film 14.

A transparent flattening film 16 is formed on the color filter 15, and then a microlens 17 having a spherical surface having a certain curvature is formed on the transparent flattening film 16.

In this embodiment, a refractive index adjusting layer 18 formed of a transparent film having refractive index lower than that of the microlens 17 so as to cover the microlens 17.

A relationship between a height Hi of the microlens 17 and a thickness of the refractive index adjusting layer 18, i.e., a height Hi from a bottom surface of the microlens 17 to an upper surface of refractive index adjusting layer 18 is established as expressed by the following equation (1).

$$H1 < Hi \tag{1}$$

Figure 6:
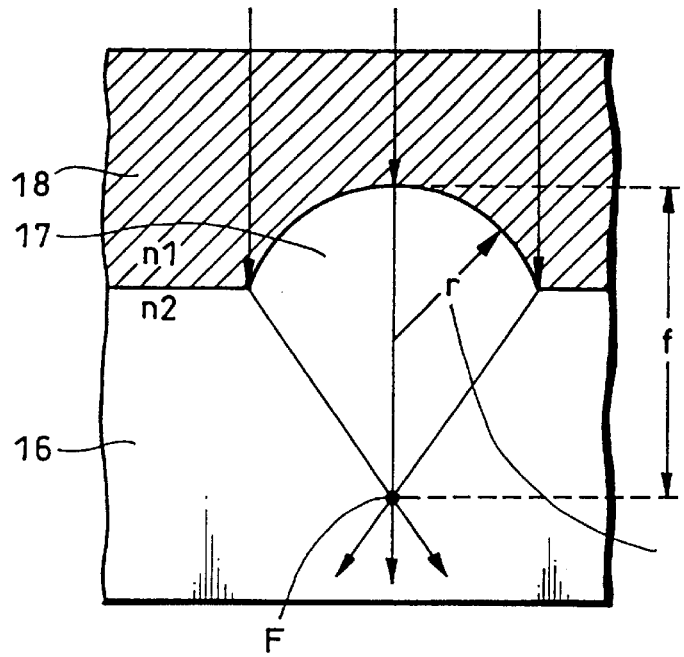
FIG. 6 is a diagram used to explain an optical path of incident light in the solid-state imaging device according to the present invention.

FIG. 6 is a schematic diagram showing a state that parallel rays of light are made incident on a microlens having refractive index of n2 and a radius r of a lens curvature through a medium having refractive index of n1.

A focal distance f of the microlens in this case can be expressed by the following equation (2).

$$f = \frac{n2}{n2 - n1} r \; [\mu m] \tag{2}$$

Figure 1:
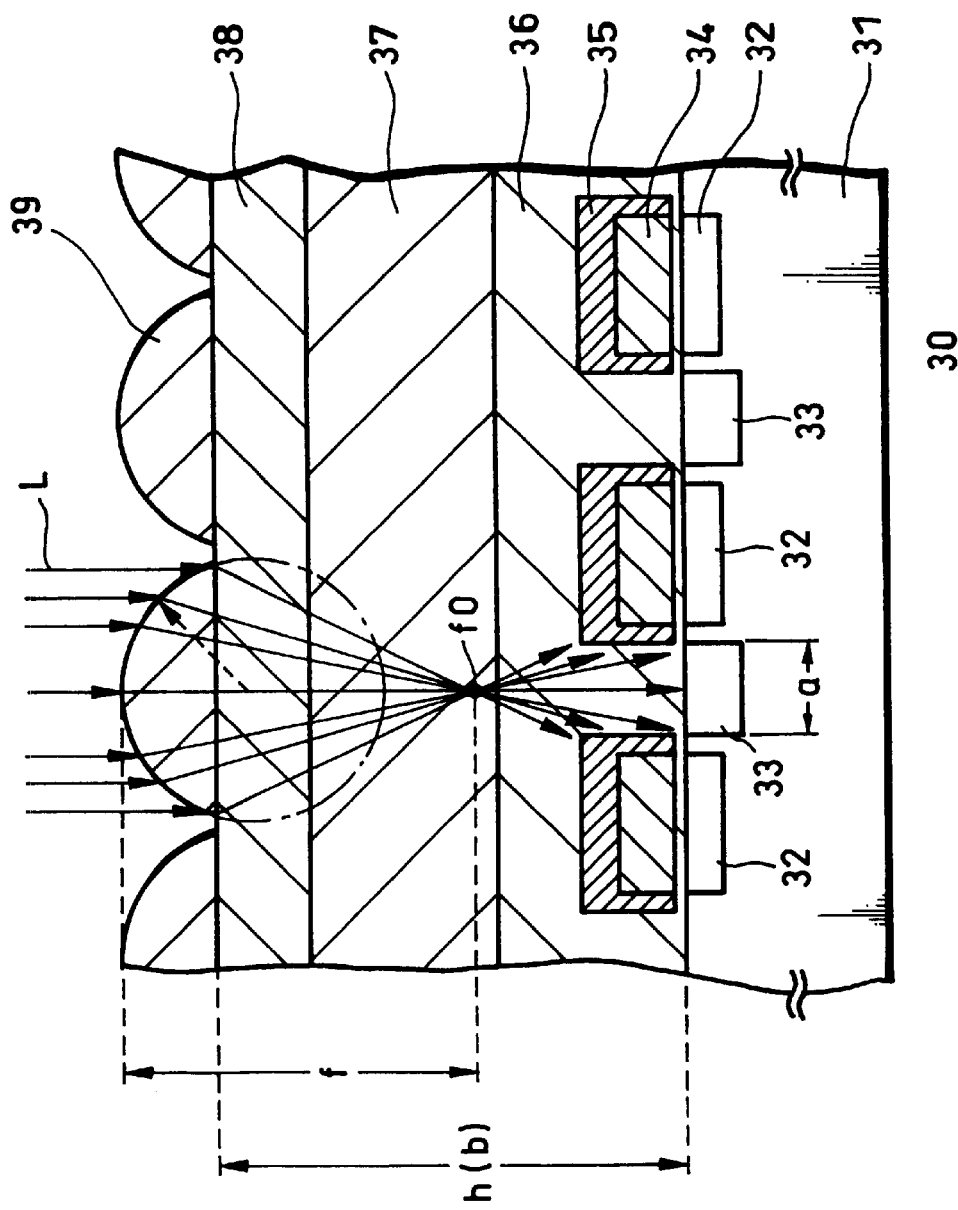
FIG. 1 is a cross-sectional view of a CCD solid-state imaging device cut along the horizontal transfer direction.

In a general solid-state imaging device shown in FIG. 1, a medium having refractive index of n1 is air (n1=1.0), and a material having refractive index of n2 is a polystyrene resin (n2≈1.6), for example.

The focal length f in this case is f≈2.67r.

In this embodiment having the structure shown in FIG. 5, if fluororesin (e.g., fluororesin having refractive index n1=1.34 and manufactured by Asahi Glass Co., Ltd. under the tradename of citop) is employed as a material for the refractive index adjusting layer 18 having the refractive index of n1, the focal length f is about 6.15r and thus can be extended about 2.3 times as long as the above focal length f of the solid-state imaging device shown in FIG. 1.

In this embodiment having the structure shown in FIG. 5, if polyimide resin (having refractive index n2≈1.75) is employed as a material for the microlens 17 having the refractive index of n1 and fluororesin (having the refractive index of n2) is employed as a material for the refractive index adjusting layer 18 having the refractive index of n1, the focal length f is about 4.2r.

Since the refractive index adjusting layer 18 formed of a transparent film having a low refractive index as compared with that of the microlens 17 is provided as described above, a focal length f of the light made incident on the microlens 17 is extended as compared with that obtained in the structure shown in FIG. 1 and a focal position is a position F which is deeper than the position f0 obtained in the structure shown in FIG. 1.

Specifically, the focal length f can be desirably controlled by combination of materials having different refractive indexes, e.g., combination of the microlens 17 having the refractive index of n1 and the refractive index adjusting layer 18 having the refractive index of n2.

Thus, the mount of light incident on the photosensor portion 2 is increased, which leads to increase of light sensitivity of the CCD solid-state imaging device 10.

In this embodiment, the anti-reflection film 19 is formed on the refractive index adjusting layer 18 in order to prevent the refractive index adjusting layer 18 from reflecting the light L made incident on the refractive index adjusting layer 18. The anti-reflection film 19 can suppress an amount of the incident light L which is decreased by reflection thereof and then made incident on the photosensor portion.

Figure 7:
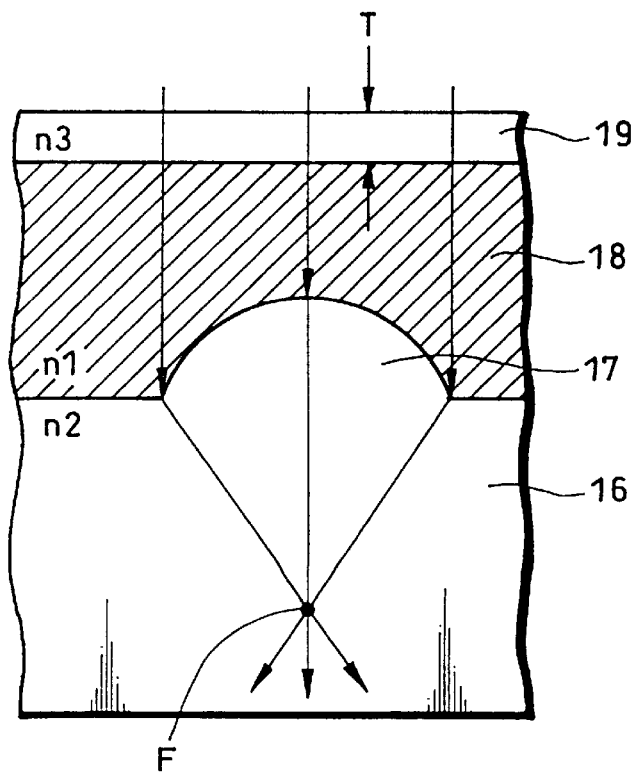
FIG. 7 is a diagram used to explain an optical path of incident light in the solid-state imaging device shown in FIG. 5.

FIG. 7 is a diagram showing an optical path obtained when the anti-reflection film 9 having the refractive index of n3 and a film thickness T is provided on the refractive index adjusting layer 18 having the refractive index of n1.

When the anti-reflection film 19 is provided on the refractive index adjusting layer 18 having the refractive index of n1 as described above, it is ideal that the refractive index of n3 of the anti-reflection film 19 and the film thickness T thereof satisfy the following conditions expressed by the equation (3).

$$n3=\sqrt{n1} \quad T=\lambda/4 \text{ (}\lambda\text{ is a wavelength of light desired to be prevented from being reflected} \tag{3}$$

It is difficult to match the refractive index of n3 of the anti-reflection film 19 and the film thickness T thereof with the conditions expressed by the equation (3). However, practically, a material having a refractive index close to the conditions of the equation (3) is employed as that for the anti-reflection film 19.

It is not required that the anti-reflection film 19 must always be provided.

It is preferable to set a ratio of the length a of the short side of the opening of the photosensor portion (the sensor portion) to the length b (layer thickness h) from the semiconductor surface, i.e., the surface of the photosensor portion 2 to the bottom surface of the microlens 17 to ⅓ or smaller.

If there is air above the microlens 39 as shown in FIG. 1, then the incident light L is converged considerably above the photosensor portion 2 and hence an amount of light made incident on the photosensor portion 2 is reduced. Further, rays of light spread after being converged are made incident on the vertical CCD register, which produces smear.

When the ratio of a/b is sufficiently large, even if the convergence position is located considerably above the surface of the photosensor portion, the photosensor portion is wide and the interval Dv between the adjacent vertical CCD registers is sufficient, which hardly arises such problem.

On the other hand, if the ratio of a/b is equal to or smaller than ⅓, then the light amount is remarkably reduced and the smear is remarkably produced. Therefore, according to the present invention, it is possible to effectively increase the amount of light incident on the photosensor portion and effectively prevents the smear by adjusting the focal length f by providing the refractive index adjusting layer 18.

While in this embodiment the focal point f1 is located above the surface of the photosensor portion 2, i.e, above the surface of the semiconductor substrate 11, the focus point f1 may be located below the surface of the light surface.

A specific design of the solid-state imaging device according to the present invention will be described by way of example.

Figure 2:
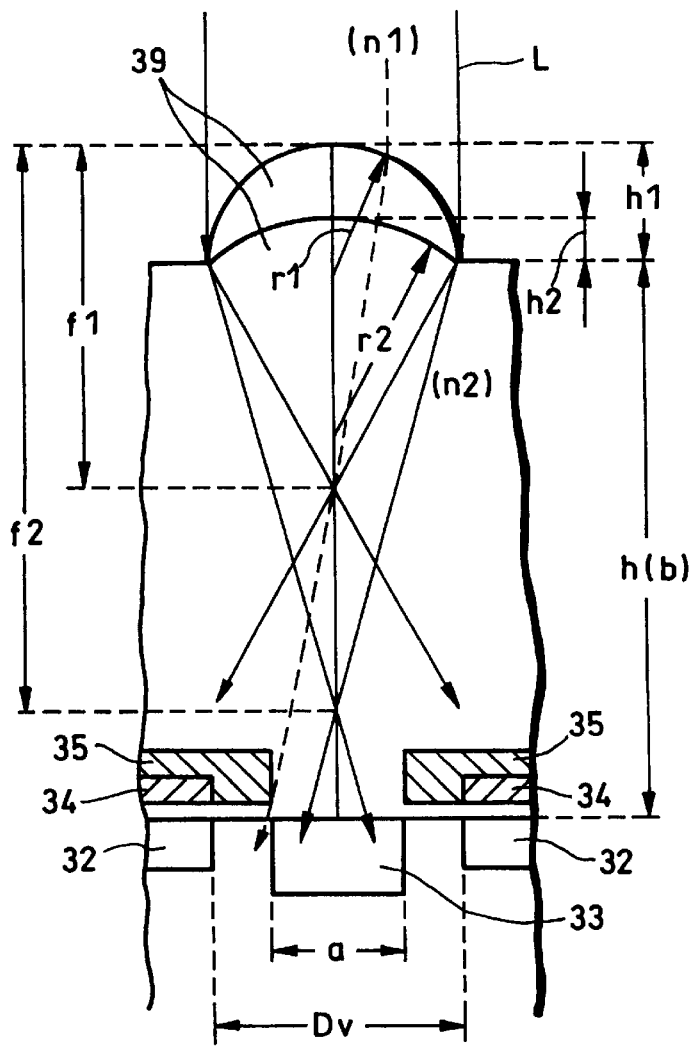
FIG. 2 is a diagram showing an example of a design of the CCD solid-state imaging device.

FIG. 2 is a schematic diagram showing a state that parallel rays of light are converged in the structure of the solid-state imaging device shown in FIG. 1 (a cross-sectional view thereof cut along the horizontal direction).

It is assumed that there is air (having the refractive index of n1=1.0) above the microlens 39 and the refractivity of the microlens and the layer thereunder is n2=1.60.

It is assumed that a thickness of the layer under the microlens 39, i.e., a layer thickness h(B) is 4.50 $\mu$m, a width a of the opening portion of the photosensor portion 33 is 1.0 $\mu$m, and an interval Dv between the adjacent vertical CCD registers 32 is 2.0 $\mu$m.

If the radius r1 of the curvature of the microlens 39 is 1.0 $\mu$m, then the height h1 of the microlens 39 is about 0.9 $\mu$m to 1.0 $\mu$m and the focal length f1 is 2.67 $\mu$m. Therefore, the incident light L is prevented from being effectively converged on the photosensor portion 33. Moreover, since the incident light L spread after convergence at the focal point is made incident on the light shielding film 34, which deteriorates the sensitivity. Since the incident light contains much components of oblique light, such components may cause the smear.

In order to extend the focal length f1, the radius r1 of the curvature of the microlens 39 has been set larger, e.g., to r2. Assuming that the radius r2 of the curvature of the micro lens is 1.7 $\mu$m, the height h2 of the microlens 39 is about 0.3 to 0.4 $\mu$m and hence the focal length f2 is extended and then set to 4.54 $\mu$m. Then, the convergence state becomes satisfactory.

However, in order to obtain the radius r2 of the curvature of 1.7 $\mu$m, the lens material must be coated so as to have a thickness of 0.2 to 0.3 $\mu$m.

At this time, it is difficult to uniformly coat the lens material because of influence of a step of a ground layer produced by a scribe line, a bonding pad or the like.

Figure 3:
FIG. 3 is a diagram used to explain a shape of a lens obtained when the lens material is made thin.

Since the lens material becomes thinner, as shown in FIG. 3, a shape of the microlens obtained by reflowing the lens material is prevented from being satisfactory, which may become a bar to satisfactorily converge light.

If on the other hand the microlens having the height h1 and the radius r1 of curvature is formed, it is sufficient to set a thickness of a coated film of the lens material to about 0.8 to 0.9 $\mu$m, and the set thickness permits the satisfactory shape of the microlens obtained after reflowing. Therefore, a design margin for obtaining a uniform lens shape is widened.

Figure 8:
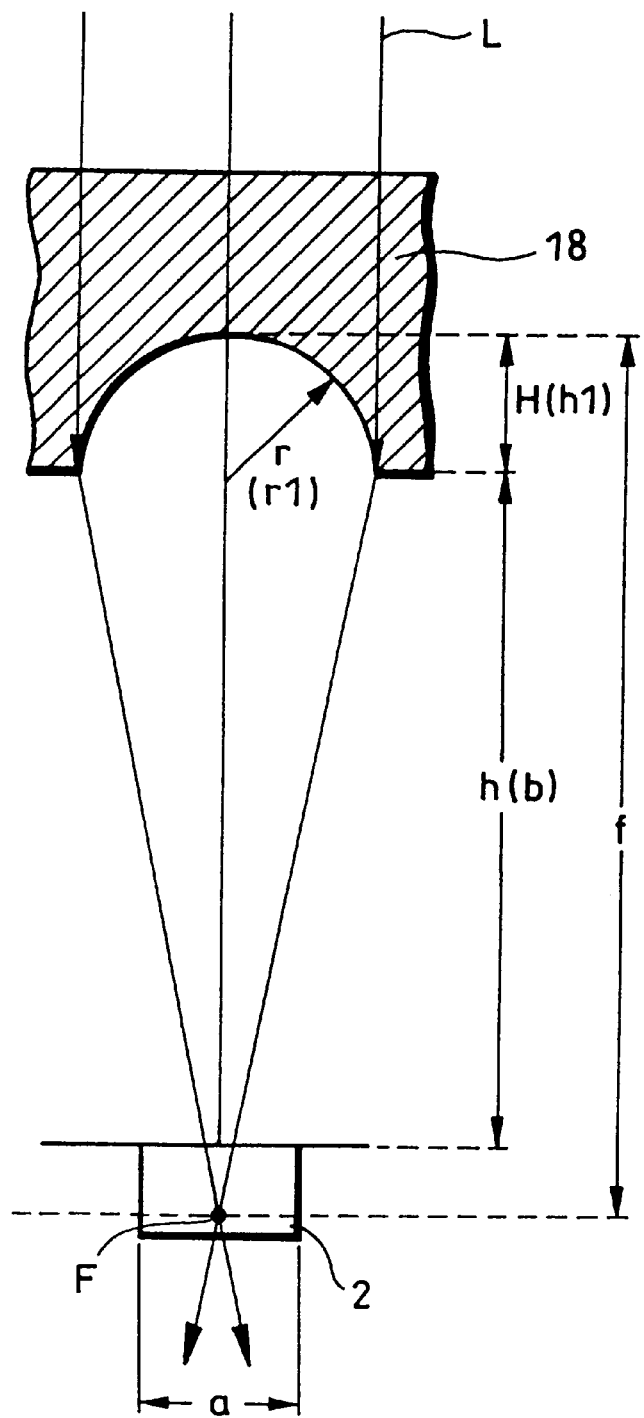
FIG. 8 is a diagram showing an example of a design of the solid-state imaging device shown in FIG. 5.

FIG. 8 is a diagram showing an example of a solid-state imaging device in which the present invention is applied to the structure shown in FIG. 2.

Initially, the microlens 17 having the same size, i.e., height H1 (h1) and the radius r (r1) of curvature as the height h1 and the radius r1 of curvature of the microlens 39 shown in FIG. 2 was formed.

A transparent resin forming the refractive index adjusting layer 18 was coated on the microlens 17 or subjected to potting (dropped) upon assembly of the package, thereby the refractive index adjusting layer 18 being formed.

A fluororesin (e.g., fluororesin manufactured by Asahi Glass Co., Ltd. under the tradename of citop and having the refractive index of n1=1.34) was employed as a material for the refractive index adjusting layer 18.

At this time, as shown in FIG. 8, the focal length f is extended up to 6.15 $\mu$m and then a convergence state becomes satisfactory.

Approximate values are employed as values of radii r, r1, r2 of curvature of the microlenses shown in FIG. 2 and 8.

A method of manufacturing the microlens 17 may be a method of directly reflowing the microlens material, a method of transferring a lens shape from a photoresist to the microlens material by etch back after reflowing the photoresist, or the like. Any of the method of manufacturing the microlens 17 may be employed.

While plural films such as the color filter, the flattening film a passivation film or the like are practically provided between the microlens and the surface of the photosensor portion, an optical path of the incident light L is shown in FIGS. 2 and 8 on the assumption that they have the same refractive indexes.

While in the embodiment the incident rays of light are in parallel to one another, the present invention is not limited thereto and can be applied to a unit cell on which light is incident diagonally with respect to the microlens.

In this case, the microlens and the photosensor portion are formed with being displaced from each other in the horizontal direction in accordance with the optical path of the incident light, so as to make the incident light incident on the photosensor portion.

It is possible to employ the refractive index adjusting layer 18 having low refractive index as compared with the refractive index of the microlens as a transparent sealing resin forming a package so as to cover the solid-state imaging device. In this case, a transparent resin having low refractive index as compared with the refractive index of the microlens is dropped on the solid-state imaging device having the microlens formed therein so as to cover the microlenses and then the dropped transparent resin is hardened, thereby the package being able to be manufactured.

Thus, it is possible to manufacture the package of the solid-state imaging device with low manufacturing costs as compared with those presented by a general package system sealing the package with glass or the like.

The anti-reflection film 19 can be formed by forming P-SiO$_2$ (n=1.45 to 1.5) by plasma chemical vapor deposition (CVD), MgF$_2$ (n=1.38) and CaF$_2$ (n=1.26 to 1.28) by sputtering and fluororesin (n=1.34) by coating.

According to the solid-state imaging device, since the layer having low refractive index as compared with that of the microlens is formed on the microlens and the uppermost surface thereof is formed as a flat surface, it is possible to improve the light sensitivity in a state that the unit cells of the solid-state imaging device are made minutely.

Moreover, if the anti-reflection film is formed on the layer having the low refractive index as compared with that of the microlens, it is possible to prevent light from being reflected by the layer having the low refractive index as compared with that of the microlens and to thereby increase the amount of light made incident on the photosensor portion.

If the layer having the low refractive index as compared with that of the microlens is employed as the transparent sealing resin forming the package so as to cover the solid-state imaging device, it is possible to manufacture the package of the solid-state imaging device with low manufacturing costs as compared with those presented by a general package system for sealing the package with glass or the like.

Having described a preferred embodiment of the present invention with reference to the accompanying drawings, it is to be understood that the present invention is not limited to the above-mentioned embodiment and that various changes and modifications can be effected therein by one skilled in the art without departing from the spirit or scope of the present invention as defined in the appended claims.

What is claimed is:

1. A solid-state imaging device comprising:
   a semiconductor substrate including at least one photosensor formed therein;
   a first transparent flattening layer on the substrate and including formed therein transfer electrodes for the photosensor;
   a color filter layer on the first transparent flattening layer;
   a second transparent flattening layer on the color filter layer;
   a microlens on the second the second transparent flattening layer in registry with the photosensor;
   a refractive index adjusting layer formed over the microlens and the second transparent flattening layer, the refractive adjusting layer having a refractive index n2 that is lower than refractive index n1 of the microlens,
   wherein,
   a focal length f of the microlens as adjusted by the refractive index adjusting layer extends into the first transparent flattening layer and is expressed by the relationship f=(n2)r/(n2-n1), where r is a radius of lens curvature of the microlens, and a top surface of the device is flat.

2. The solid state imaging device of claim 1, further comprising an anti-reflection film formed on the refractive index adjusting layer, the anti-reflection film characterized by an index of refraction n3 which is equal to the square root of the index of refraction n1, and by a thickness T which is equal to a quarter of a wavelength of light which is to pass through the anti-reflection film.

3. The solid-state imaging device of claim 1, wherein the focal length f extends at least to within a space flanked by the transfer electrodes.

4. A method of manufacturing a solid-state imaging device, said method comprising the steps of:
   forming a semiconductor substrate including at least one photosensor therein;
   forming a first transparent flattening layer on the substrate and including therein transfer electrodes for the photosensor;
   forming a color filter layer on the first transparent flattening layer;
   forming a second transparent flattening layer on the color filter layer;
   forming a microlens on the second the second transparent flattening layer in registry with the photosensor;
   forming a refractive index adjusting layer over the microlens and the second transparent flattening layer, the refractive adjusting layer having a refractive index n2 that is lower than a refractive index n1 of the microlens and made of a transparent resin;
   wherein;
   a focal length f of the microlens as adjusted by the refractive index adjusting layer extends into the first transparent flattening layer and is expressed by the relationship f=(n2)r/(n2-n1), where r is a radius of lens curvature of the microlens; and
   a top surface of the device is flat.

5. A solid-state imaging device according to claim 1, wherein a ratio of a length a of a short side a of a space defined between said electrodes above said photosensor to a length b from an upper surface of the semiconductor substrate to a lens bottom edge of said microlens is set to ⅓ or smaller.

6. A method of manufacturing a solid-state imaging device according to claim 4, wherein said refractive index adjusting layer is formed by coating said transparent resin on said microlens.

7. A method of manufacturing a solid-state imaging device according to claim 4, wherein said refractive index adjusting layer is formed by dropping (potting) said transparent resin on said microlens, and serves as resin for sealing a package of said solid-state imaging device.

8. A method of manufacturing a solid-state imaging device according to claim 4, wherein an anti-reflection film is formed on said refractive index adjusting layer.

9. A method of manufacturing a solid-state imaging device according to claim 4, wherein a ratio of a length a of a a space over said photosensor between said electrodes to a length b from an upper surface of the semiconductor substrate to a lens bottom edge of said microlens is set to ⅓ or smaller.

10. The method of claim 8, wherein the anti-reflection film characterized by an index of refraction n3 which is equal to the square root of the index of refraction n1, and by a thickness T which is equal to a quarter of a wavelength of light which is to pass through the anti-reflection film.

* * * * *